United States Patent

Hamajima et al.

[11] Patent Number: 5,869,386
[45] Date of Patent: Feb. 9, 1999

[54] METHOD OF FABRICATING A COMPOSITE SILICON-ON-INSULATOR SUBSTRATE

[75] Inventors: Tomohiro Hamajima; Kenichi Arai, both of Tokyo, Japan

[73] Assignee: NEC Corporation, Japan

[21] Appl. No.: 710,851

[22] Filed: Sep. 23, 1996

[30] Foreign Application Priority Data

Sep. 28, 1995 [JP] Japan .................................. 7-251556

[51] Int. Cl.[6] .................................................. H01L 21/30
[52] U.S. Cl. .......................... 438/455; 438/406; 438/459; 438/975; 438/977; 148/DIG. 102
[58] Field of Search ......................... 437/228, 228 MRK, 437/235, 21, 86, 250, 924, 927, 974; 148/DIG. 12, DIG. 102; 156/629.1; 216/27; 430/22; 438/406, 455, 459, 928, 975, 977

[56] References Cited

U.S. PATENT DOCUMENTS

| | | | |
|---|---|---|---|
| 4,599,792 | 7/1986 | Cade et al. | 148/DIG. 135 |
| 5,240,883 | 8/1993 | Abe et al. | 437/228 |
| 5,294,556 | 3/1994 | Kawamura | 437/21 |
| 5,335,550 | 8/1994 | Satou | 73/727 |
| 5,369,050 | 11/1994 | Kawai | 438/406 |
| 5,478,782 | 12/1995 | Satoh et al. | 437/250 |
| 5,496,764 | 3/1996 | Sun | 438/406 |

FOREIGN PATENT DOCUMENTS

| | | | |
|---|---|---|---|
| 2-312220 | 12/1990 | Japan | H01L 21/02 |
| 4-29353 | 1/1992 | Japan | H01L 21/76 |

*Primary Examiner*—Trung Dang
*Attorney, Agent, or Firm*—Hayes, Soloway, Hennessey, Grossman & Hage, P.C.

[57] ABSTRACT

Disclosed herein is a composite SOI substrate which allows, by use of a conventional visible light aligner, high-precision alignment of insulator film patterns buried in an SOI substrate and patterns which are to be formed on the SOI layer located above it. The composite SOI substrate is fabricated by forming alignment oxide film patterns I a on the periphery of a main surface of a first silicon substrate 10 which also has buried oxide film patterns formed thereon; preparing a second silicon substrate having preferably V-shaped notch sections 9 on its periphery to expose the alignment patterns provided on the first silicon substrate; bonding the second silicon substrate to the main surface side of the first silicon substrate 10 while exposing the alignment oxide film patterns 1*a*; and then thinning the second silicon substrate to form an SOI layer 20*a*. In order to expose the alignment patterns, the second silicon substrate may either have a width smaller than the first silicon substrate by having a pair of orientation flats corresponding to the alignment patterns, or the substrates may be circular with the diameter of the second silicon substrate being smaller than the first silicon substrate. The alignment patterns may also be exposed by thinning the peripheral portion of the first silicon substrate from the back side surface after bonding has been done.

11 Claims, 5 Drawing Sheets

METHOD OF FABRICATING A COMPOSITE SILICON-ON-INSULATOR SUBSTRATE

BACKGROUND OF THE INVENTION

1. Field of the Invention

The present invention relates to a structure of a bonded composite Silicon-On-Insulator (hereafter, SOI) substrate, and a method of fabricating the same.

2. Description of the Related Art

Multi-layer-structured substrates represented by SOI substrates fabricated by substrate bonding techniques have recently found increased applications in conjunction with improvements in its bonding performance. Particularly, those SOI substrates having insulator layers such as buried silicon oxide layers have been put to practical use as dielectric isolation substrates in the fields of power ICs, etc. which require high withstand voltages. In the field of power devices, requirement for high density and high withstand voltage has been satisfied by locally providing an SOI structure on the surface of the substrate, thereby forming a high withstand voltage, vertical power MOSFET device region and a low withstand voltage, control circuit device region on a single chip. This is described in, for example, Japanese Unexamined Patent Application Disclosure (KOKAI) HEI 4-29353. A method of fabricating SOI substrates of this type will now be explained with reference to FIG. 8.

First, a surface step approximately 1 $\mu$m high is formed in a given portion of the surface of an $N^+$ type (100) silicon substrate 21 by RIE (Reactive Ion Etching) or other etching methods. This is illustrated in FIG. 8(a). A silicon oxide film 22 is formed by thermal oxidation or other methods over the entire surface of the silicon substrate 21. The elevated portion of the silicon oxide film 22 is then removed by mechanical abrasion to provide an even flattened surface composed of single-crystal silicon 21 and silicon oxide film 22. The silicon substrate thus formed will hereafter be called a "second" substrate.

Then, as illustrated in FIG. 8(b), the second silicon substrate 21 is flipped over and its flattened side surface including the silicon oxide film 22 is placed in direct contact, face to face with a main surface of an $N^-$ type (100) silicon substrate 11, which we will call as the first substrate. The composite structure obtained is then subjected to thermal annealing to ensure bonding. Finally, as illustrated in FIG. 8(c), the non-bonded surface of the second silicon substrate 21 is thinned to a predetermined thickness by a grinding and polishing process. In this way, a thin-film, single-crystal silicon layer is preferentially formed on the silicon oxide film 22. Hereafter, the single-crystal silicon layer thus formed will be referred to as the "SOI layer".

This SOI layer is further processed to form a control circuit device region in a later step. The control circuit device region is dielectrically isolated from the region for forming a vertical power MOSFET device by the now buried silicon oxide film 22 and an oxide film 22a and a polysilicon film 23 which are later formed in a V-shaped trench within the second silicon substrate 21.

Here, the buried oxide film 22 is patterned as desired, depending on the pattern of the control circuit device formed in the SOI layer on top of it. Therefore, in the early stages of the process of forming the device on the surface of the SOI layer, it is necessary to accomplish alignment of a photolithographic mask pattern and the patterns of the buried oxide film 22. However, being covered with the overlying SOI layer, the pattern of the buried oxide film cannot be observed with visible light.

One means for observing structures which are buried in bonded silicon substrates is use of images resulting from transmission of infrared light. In this connection, Japanese Unexamined Patent Application Disclosure (KOKAI) HEI 2-312220, for example, discloses an aligner based on this method. This apparatus is used for alignment of a plurality of substrates each having device layers formed thereon.

An explanation will now be given with reference to FIG. 7, regarding a method for alignment of buried oxide film patterns and mask patterns, which utilizes the principle of the infrared aligner. FIG. 7 illustrates a cross sectional view of an SOI substrate and a phtolithography mask in an initial optical alignment step for fabricating a bonding SOI substrate. Formed in a first silicon substrate 10 are oxide film patterns composed of oxide films 1b for device isolation and oxide films 1a for alignment. An SOI layer 20b is bonded on the top surface of the first silicon substrate 10 thereby constituting a bonded substrate. A photoresist film 3 is applied to the other face of the SOI layer 20b. Held above the bonding substrate is a quartz substrate 4 as the photomask which has mask patterns 5A and 5B, and both the quartz substrate 4 and the bonding SOI substrate are configured in a movable manner (a wafer chuck and other devices not shown).

With this configuration, alignment of the alignment mask patterns 5A and the alignment oxide film patterns 1a is accomplished through the use of an image provided by transmission of infrared lights 6 emitted from an infrared radiation source placed under the silicon substrate 10. This transmitted infrared image is observed with two or more infrared microscopes.

Conventional, widely used visible-light aligners cannot be used for SOI substrates with alignment patterns buried therein, and it is necessary to additionally provide an infrared radiation source, an infrared microscope, a wafer chuck which transmits infrared radiation, etc. In addition, the restricted field of view resulting from the inability to irradiate the entire surface of the substrate due to the use of an infrared source, and low contrast of the transmitted image make it difficult to recognize shapes of fine alignment patterns and thus to accomplish alignment. This, of course, presents the problem of low alignment precision of approximately ±1 $\mu$m. Therefore, displacements due to failure in alignment have inevitably impaired the device characteristics.

SUMMARY OF THE INVENTION

In order to overcome the above-mentioned drawbacks of the prior art, it is an object of the present invention to provide an SOI substrate with alignment patterns which allow use of visible light aligners and a method of fabricating such SOI substrates.

An SOI substrate according to a first aspect of the present invention is a composite SOI substrate which comprises a first silicon substrate having a main surface on which are formed a plurality of insulator film patterns including alignment patterns on the periphery portion; and a second silicon substrate bonded to the first silicon substrate, in contact with the first silicon substrate's insulator film pattern-formed surface. The SOI substrate according to a first embodiment is characterized in that the alignment patterns composed of insulator films and formed on the periphery of the first silicon substrate are exposed after bonding is performed. That is, at least part of the periphery of the second silicon substrate is removed, or the periphery of the first silicon substrate is formed with the same thickness as that of the insulator films in order to expose the alignment patterns.

A second aspect of the present invention is a method of fabricating an SOI substrate comprising: a step of forming a plurality of patterns of insulator films on a surface of a first silicon substrate, the plurality of patterns including alignment patterns formed on its periphery; a step of forming a plurality of notch sections on a periphery portion of a second silicon substrate; and a step of bonding the second silicon substrate to the insulator film pattern-formed surface of the first silicon substrate while positioning the notch sections above the alignment patterns so as to expose those alignment patterns.

A third aspect of the present invention is a method of fabricating an SOI substrate comprising: a step of forming a plurality of patterns of insulator films on a surface of a first silicon substrate, the plurality of patterns including alignment patterns formed on its periphery; and a step of bonding a second silicon substrate, which has a smaller radius than the first silicon substrate, to the insulator film pattern-formed surface of the first silicon substrate so as to expose the alignment patterns.

A fourth aspect of the present invention is a method of fabricating an SOI substrate comprising: a step of forming a plurality of patterns of insulator films on a surface of a first silicon substrate, including alignment patterns formed on its periphery; a step of bonding a second silicon substrate to the insulator film pattern-formed surface of the first silicon substrate; and a step of removing the periphery of the second silicon substrate to expose the alignment patterns formed on the periphery of the first silicon substrate.

A fifth aspect of the present invention is a method of fabricating an SOI substrate comprising: a step of forming a plurality of patterns of insulator films on a surface of a first silicon substrate, including alignment patterns formed on its periphery; a step of bonding a second silicon substrate to the insulator film pattern-formed surface of the first silicon substrate; and a step of grinding or etching away the periphery of the bottom-side of the first silicon substrate to expose the alignment patterns composed of the insulator films bonded to the second silicon substrate.

BRIEF DESCRIPTION OF THE DRAWINGS

The above and other objects, advantages and features of the present invention will be more apparent from the following description taken in conjunction with the accompanying drawing in which.

DETAILED DESCRIPTION OF THE PREFERRED EMBODIMENTS

The present invention will now be explained with reference to the drawings. FIG. 1(a) through FIG. 1(d), and FIG. 2(a) and FIG. 2(b) are cross sectional views and plan views, respectively, illustrative of a first embodiment according to the present invention.

Figure 1A:
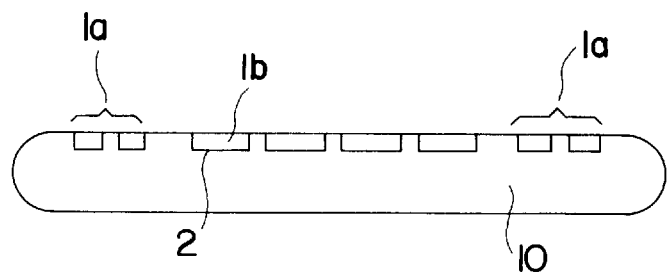
FIG. 1 is a cross sectional view of a silicon substrate, illustrative of a first embodiment according to the present invention.
Figure 2A:
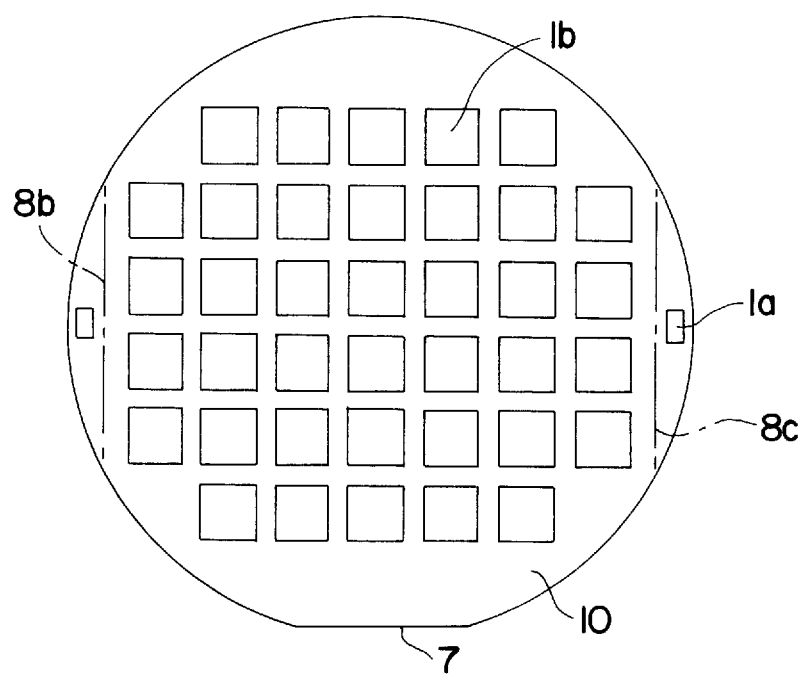
FIG. 2 is a plan view of a silicon substrate, illustrative of the first embodiment according to the present invention.

Five-inch diameter first and second silicon substrates 10 and 20 having an (100) oriented main surface are prepared. An oxide film (not shown) is formed on the surface of the first silicon substrate 10 by thermal oxidation or the like, and subsequently patterned to form openings for delineating oxide film patterns 1b in a coming process step. The first silicon substrate 10 is then etched in with the oxide film as an etching mask, to form trenches 2 approximately 1 $\mu$m deep. The depths of the trenches may vary depending on the characteristics desired for the particular devices. The silicon oxide film used as the mask is then removed, and subsequently an oxide film of an even film thickness which approximately matches the depths of the trenches 2 is formed by thermal oxidation, low-temperature CVD or other methods. As shown in FIG. 1(a) and FIG. 2(a), the oxide film is then removed by grinding and polishing to leave the portions buried in the trenches in place, thus forming device-isolation oxide film patterns 1b at the inner portion of the first silicon substrate 10, as well as alignment oxide film patterns 1a on the periphery thereof. The oxide film patterns 1b and the alignment oxide film patterns 1a are simultaneously patterned using a single lithographic mask in this way. It is noted that the oxide film patterns 1a and 1b may be oxide films provided by LOCOS.

Figure 2B:
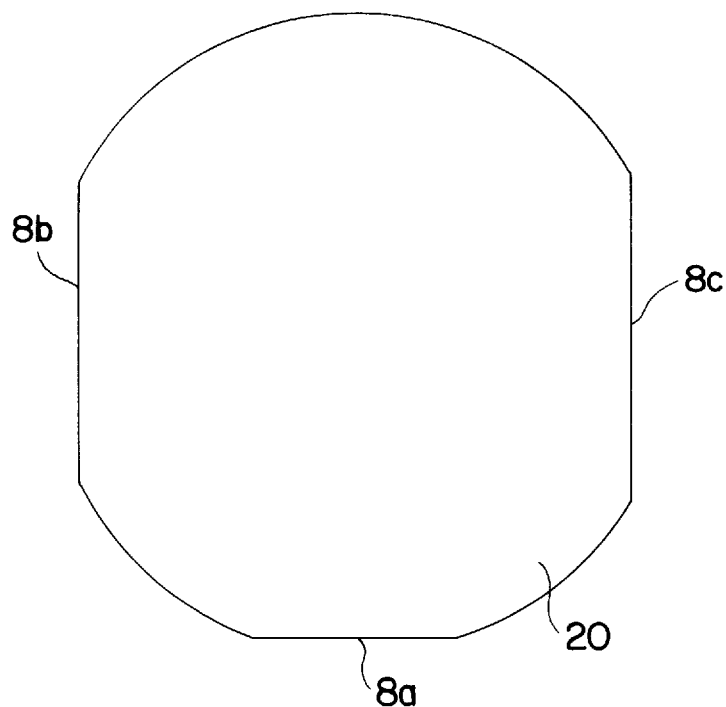

The second silicon substrate 20 has three orientation flats (OFs) 8 formed on its periphery as shown in FIG. 2(b). Of these flats, a first orientation flat 8a is used in combination with the orientation flat 7 of the first silicon substrate 10 so as to align the two substrates' crystallographic orientation. Second and third orientation flats 8b and 8c are formed with lengths necessary to expose the alignment oxide film patterns 1a (e.g., a 40-mm length in the <110> direction).

Figure 1B:
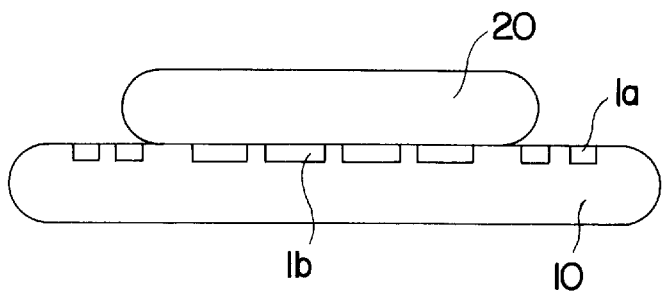

Subsequently, as shown in FIG. 1(b), the second silicon substrate 20 is bonded to the first silicon substrate 10 while placing the second and third orientation flats 8b and 8c so as not to cover the alignment oxide film patterns 1a formed on the first silicon substrate. This results in burying of the oxide film patterns 1b formed in the first silicon substrate 10 at the interface with the second silicon substrate 20. The bonded and integrated substrates are then subjected to thermal processing in an oxidizing atmosphere at 1,100°–1,200° C. for two hours to ensure the bonding.

Figure 1C:
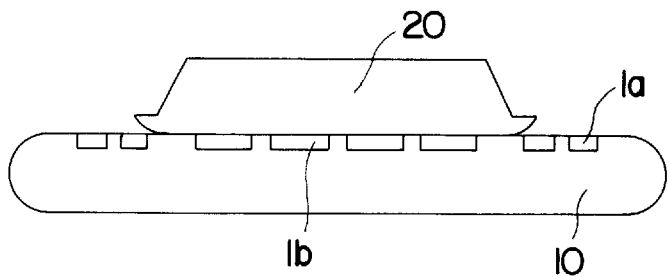
Figure 1D:
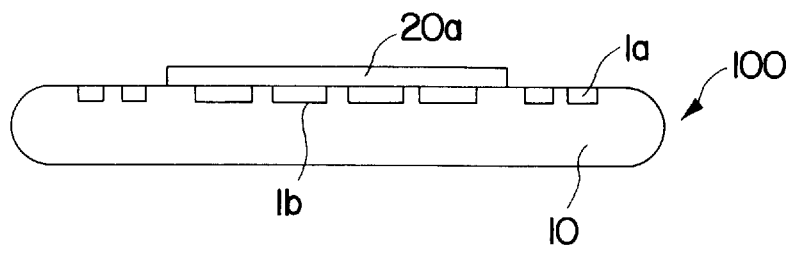

As shown in FIG. 1(c), the sections of the three orientation flats 8 and the periphery of the second silicon substrate 20 are then removed by grinding. As shown in FIG. 1(d), the non-bonded backside face of the second silicon substrate 20 is then thinned by grinding and polishing to form an SOI layer 20a approximately 10 $\mu$m thick. The SOI layer is designed to have a thickness necessary to ensure the operation of the device. Finally, an oxide film (not shown) undesirably formed on the substrate surface during the thermal processing step is etched off with dilute hydrofluoric acid to provide a bonding SOI substrate 100.

As described above, the SOI substrate 100 according to the present embodiment, has exposed alignment oxide film patterns 1a on the periphery of the first silicon substrate 10.

This allows use of conventional visible light aligners for alignment with the mask, with a precision on the order of ±0.2 μm.

Figure 3:
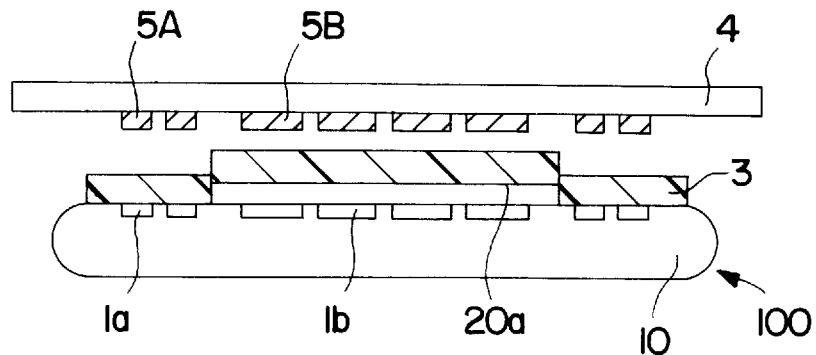
FIG. 3 is a cross sectional view illustrative of a method for alignment with a mask when an SOI substrate according to the present invention is used.

An explanation will now be given regarding an alignment method with reference to FIG. 3 which is a cross sectional view of the SOI substrate and the mask. In FIG. 3, a photoresist film 3 is applied on the surface of the SOI substrate 100 that includes the SOI layer 20a. Located over the SOI substrate 100 is a quartz substrate 4 which constitutes a photolithographic mask with mask patterns formed on its surface. Of the mask patterns, alignment mask patterns 5A placed along the marginal section of the quartz substrate 4 and the alignment oxide film patterns 1a on the substrate 10 are used to perform alignment with visible light. This allows high-precision alignment of the mask patterns 5B on the quartz substrate 4 and the oxide film patterns 1b. After this, the photoresist film 3 applied to the surface of the SOI layer 20a is exposed to ultraviolet radiation of a wavelength of 400 nm, for example, to transfer the mask patterns 5B to the photoresist film 3. The foregoing procedures for alignment may be accomplished with high precision, since they may be performed with an optical aligner of the prior art.

This method of mask alignment using a substrate having alignment patterns allows high-precision alignment in a process for fabricating a multilayer device by forming a device on a first silicon substrate with alignment patterns formed thereon, and forming a device on a second silicon substrate which is bonded to the first silicon substrate.

Figure 4:
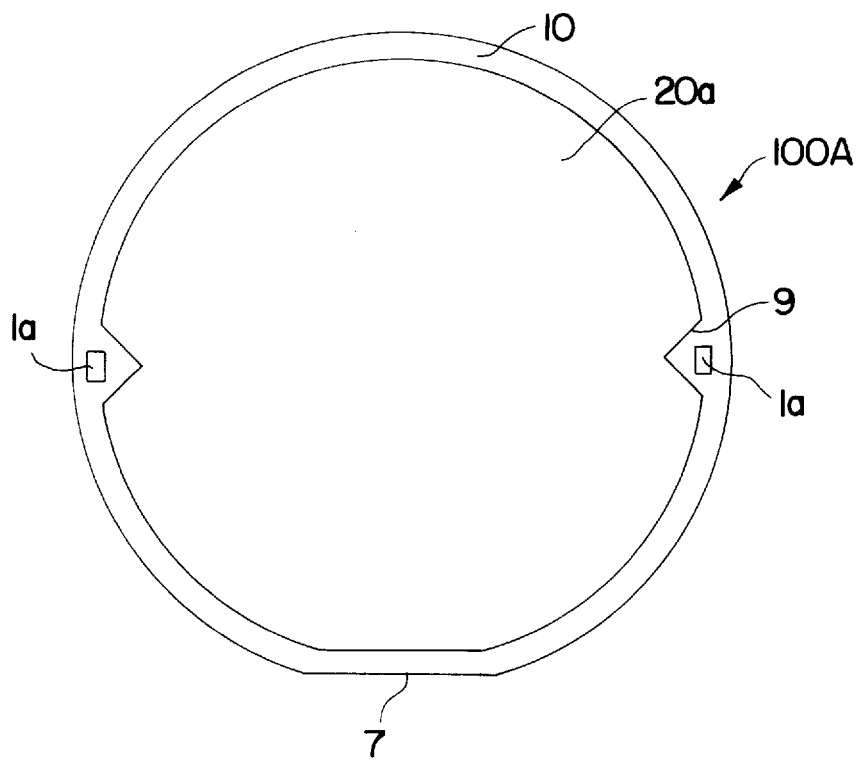
FIG. 4 is a plan view of a silicon substrate, illustrative of a second embodiment according to the present invention.

FIG. 4 is a plan view of an SOI substrate 100A, illustrative of the second embodiment according to the present invention. Alignment oxide film patterns 1a are placed on the periphery of a first silicon substrate 10 in the same manner as the first embodiment. However, V-shaped notch sections 9 are formed on the periphery of a second silicon substrate 20, and the two notch sections 9 serve to expose the alignment oxide film patterns 1a.

A method for fabricating the SOI substrate 100A will now be explained. The second silicon substrate 20 has two V-shaped notch sections 9 approximately 2 mm long and approximately 2 mm wide. The shape of the notch sections may be formed as desired, for example, U-shaped, trapezoidal or rectangular. The second silicon substrate 20 is bonded to the first silicon substrate 10 facing the side which has the alignment oxide film patterns 1a formed therein while ensuring exposure of the oxide film patterns 1a by way of the notch sections 9. The periphery of the second silicon substrate 20 is then subjected to grinding and etching to remove the non-bonding sections. Finally, the SOI layer 20a is formed by thinning, and the undesired oxide film formed on the substrate surface is removed to provide the SOI substrate 100A.

According to the present embodiment, since the alignment patterns are exposed by provision of notch sections having smaller areas than the OFs, more chip products may be obtained from substrates with a given diameter than according to the first embodiment. Here, it is to be noted that although the foregoing explanation concerns a second silicon substrate provided with two notch sections, it may of course be provided with three or more.

Figure 5:
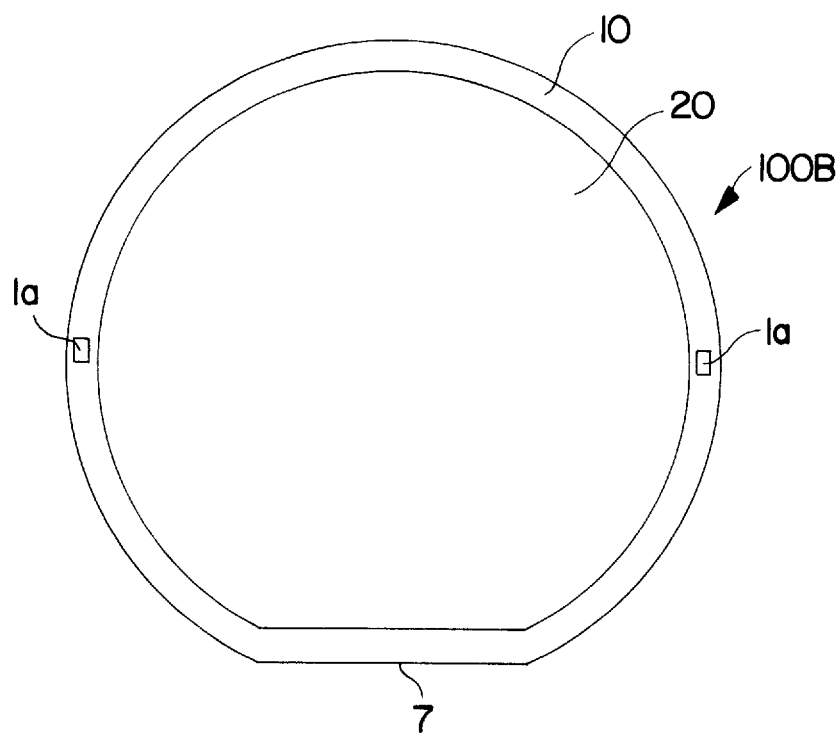
FIG. 5 is a plan view of a silicon substrate, illustrative of a third embodiment according to the present invention.

FIG. 5 is a plan view of an SOI substrate, illustrative of a third embodiment according to the present invention. In a similar manner as the first embodiment, alignment oxide film patterns 1a are placed on the periphery of a first silicon substrate 10, and exposed by removing the periphery of a second silicon substrate 20 through grinding and etching processing. Since the entire periphery of the silicon substrate is removed, three or more alignment oxide film patterns may be provided. A method for fabricating the substrate will now be explained. The oxide film patterns 1a and 1b are formed in the same manner as the first embodiment. The second silicon substrate 20 is then prepared, and bonded to the surface of the first silicon substrate 10 which has the oxide film patterns 1a and 1b formed therein. Here, the thermal processing conditions are the same as those of the first embodiment. Next, an approximately 1 mm-wide periphery along the wafer edge of the second silicon substrate 20 is ground to a thickness on the order of 50 μm, and the composite is then immersed into an anisotropic etching solution such as a potassium hydroxide solution to remove the signal-crystal silicon layer exposed by grinding. The etching time and the solution temperature are set so as to accomplish the exposure of the alignment oxide film patterns 1a. Finally, the SOI layer 20a is formed, and the undesired oxide film formed on the substrate surface is then removed to provide an SOI substrate 100B.

Unlike the first embodiment, the present embodiment does not require the formation of OFs, and this allows use of a conventional single-crystal silicon substrate used in case of the related art as the second silicon substrate. In addition, since the removal of the periphery of the second silicon substrate results in simultaneous removal of the non-bonded portions and weakly-bonded portions frequently seen at the peripheral portion, no cracking or breakage occurs therein.

Figure 6:
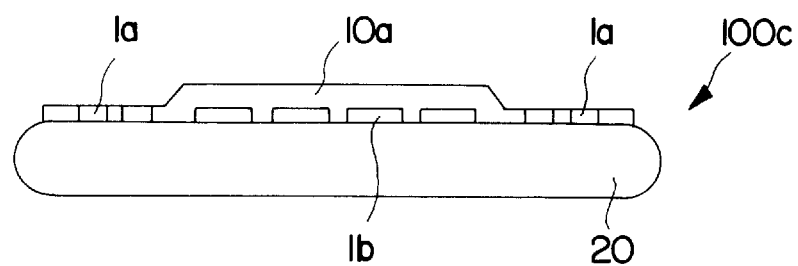
FIG. 6 is a plan view of a silicon substrate, illustrative of a fourth embodiment according to the present invention.
Figure 7:
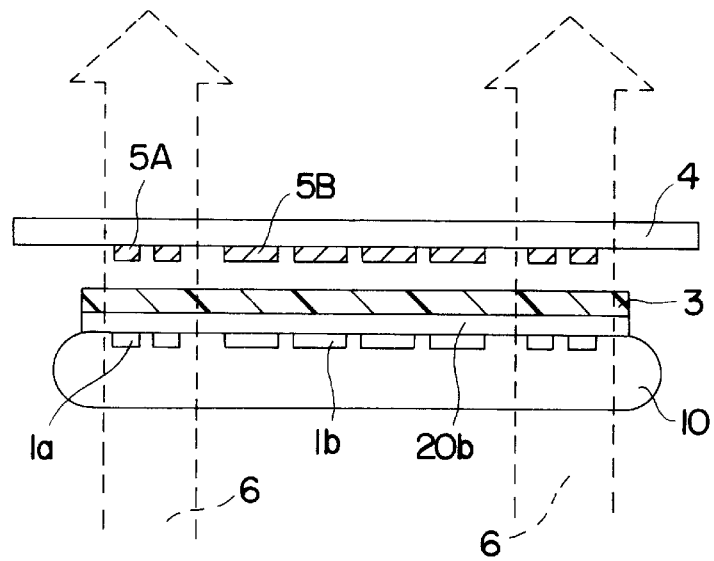
FIG. 7 is a cross sectional view illustrative of a method for alignment with a mask when a conventional SOI substrate is used.
Figure 8A:
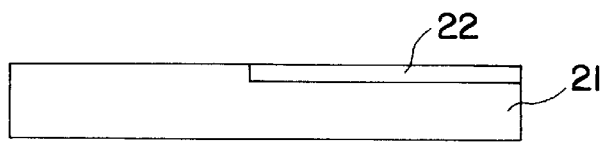
FIG. 8 is a cross sectional view illustrative of a conventional method of fabricating conventional SOI substrates.
Figure 8B:
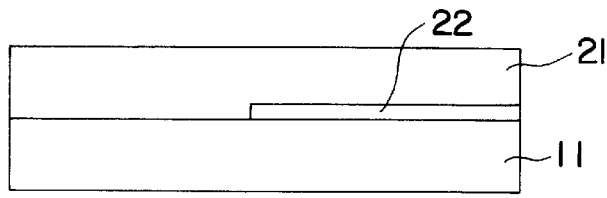
Figure 8C:
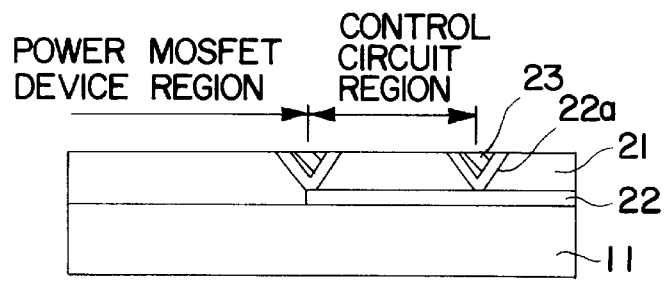

FIG. 6 is a cross sectional view of an SOI substrate, illustrative of the fourth embodiment according to the present invention, which particularly shows the state where the backside of a first silicon substrate with an oxide film formed thereon rather than the second silicon substrate is removed by etching or otherwise, to form an SOI layer and further expose the alignment patterns.

More specifically, in FIG. 6, bonded to the surface of a second silicon substrate 20 is a first silicon substrate 10 with alignment oxide film patterns 1a and oxide film patterns 1b for device isolation. The backside of the first silicon substrate 10 is then ground or treated with an anisotropic alkali etch to form an SOI layer 10a and to thin the periphery to a thickness same as that of the oxide film, thereby exposing the alignment oxide film patterns 1a.

According to the present embodiment, the bonded interface of the two substrates forms the lower side interface of the buried oxide film patterns 1b. With this configuration, voids (non-bonded portions) or crystal defects which may be formed in the bonded interface, or contaminants which may be captured during the bonding process and which may adversely affect device performance are separated from the SOI layer 10a by the buried oxide film. Accordingly, an SOI substrate 100C configured as described above, particularly the region on the SOI layer 10a on the buried oxide film, allows fabrication of a high-precision device which causes very few malfunctions.

While the present invention has been described by certain preferred embodiments, it is to be understood that the subject matter encompassed by way of the present invention is not to be limited to those specific embodiments. A variety of changes, modifications or variations may be made without departing from the spirit of the present invention.

For example, the alignment oxide film patterns, being formed simultaneously with the oxide film patterns which are buried, may have any desired thickness (though limits are imposed depending on the desired characteristics of the device) if they do not drop out of sight during the step of processing the SOI substrate, and have recognizable film thicknesses (approximately 100 nm or more) at the time of alignment. In addition, although patterns of silicon oxide films are formed in the embodiments of the present invention, the patterns may be formed of such materials as silicon nitride films ($Si_3N_4$) or doped silicate glass as well. Furthermore, since the shapes of the alignment patterns may be those used according to conventional alignment methods using visible light, the patterns may be shaped as desired, for example, as bands, rectangles, orthogonal lattices or orthorhombic lattices.

As described above, the present invention, which allows alignment with a conventional optical aligner by exposing alignment patterns composed of insulator films formed on the periphery of a silicon substrate, accomplishes higher-precision alignment than using transmitting infrared radiation. In addition, the present invention allows high-precision alignment in the step of fabricating a semiconductor apparatus of a multilayer structure having devices formed on both a silicon substrate with alignment patterns formed therein and the surface of an SOI layer.

What is claimed is:

1. A method of fabricating a composite SOI substrate comprising:

a step of forming a plurality of patterns of insulator films buried in a main surface of a first silicon substrate, said plurality of patterns including alignment patterns formed on a peripheral portion of said first silicon substrate;

a step of forming at least two notch sections on a peripheral portion of a second silicon substrate; and a step of bonding said silicon substrate to said main surface of said first silicon substrate while aligning said notch sections over said alignment patterns using visible light radiation to expose said alignment patterns.

2. The method of fabricating a composite SOI substrate as claimed in claim 1, wherein said step of bonding includes treating said first and second silicon substrates in an oxidizing atmosphere at 1100° to 1200° C.

3. A method of fabricating a composite SOI substrate comprising:

a step of forming a plurality of patterns of insulator films buried in said main surface of a first silicon substrate, said plurality of patterns including alignment patterns formed on a peripheral portion of said first silicon substrate; and a step of bonding a second silicon substrate to said main surface of said first silicon substrate, said second silicon substrate having a lateral width smaller than said first silicon substrate to expose said alignment patterns.

4. The method of fabricating a composite SOI substrate as claimed in claim 3, wherein said step of bonding includes treating said first and second silicon substrates in an oxidizing atmosphere at 1100° to 1200° C.

5. The method of fabricating a composite SOI substrate as claimed in claim 3, wherein said first silicon substrate and said second silicon substrate are substantially circular and a radius of said second silicon substrate is smaller than a radius of said first silicon substrate radius.

6. A method of fabricating a composite SOI substrate comprising:

a step of forming a plurality of patterns of insulator films on a main surface of a first silicon substrate, said plurality of patterns including alignment patterns formed on a peripheral portion of said first silicon substrate;

a step of bonding a second silicon substrate to said main surface of said first silicon substrate using visible light radiation to expose said alignment patterns; and a step of removing a peripheral portion of said second silicon substrate to expose said alignment patterns formed on said first silicon substrate.

7. The method of fabricating a composite SOI substrate as claimed in claim 6, wherein said step of bonding includes treating said first and second silicon substrates in an oxidizing atmosphere at 1100° to 1200° C.

8. A method of fabricating a composite SOI substrate comprising:

a step of forming a plurality of patterns of insulator films buried in a main surface of a first silicon substrate, said plurality of patterns including alignment patterns formed on a peripheral portion of said first silicon substrate;

a step of bonding a second silicon substrate to said main surface of said first silicon substrate; and a step of removing a peripheral portion of said first silicon substrate from a surface opposite said main surface to expose said alignment patterns composed of said insulator films buried in said peripheral portion of said main surface using visible light radiation to expose said alignment patterns.

9. The method of fabricating a composite SOI substrate as claimed in claim 8, wherein said step of bonding includes treating said first and second silicon substrates in an oxidizing atmosphere at 1100° to 1200° C.

10. A method of fabricating a composite SOI substrate comprising:

a step of forming a plurality of patterns of insulator films buried in a main surface of a first silicon substrate, said plurality of patterns including alignment patterns formed on a peripheral portion of said first silicon substrate;

a step of forming at least two notch sections on a peripheral portion of a second silicon substrate; and a step of bonding said silicon substrate to said main surface of said first silicon substrate while aligning said notch sections over said alignment patterns to expose said alignment patterns, wherein said step of bonding includes treating said first and second silicon substrates in an oxidizing atmosphere at 1100° to 1200° C.

11. A method of fabricating a composite SOI substrate comprising:

a step of forming a plurality of patterns of insulator films buried in a main surface of a first silicon substrate, said plurality of patterns including alignment patterns formed on a peripheral portion of said first silicon substrate;

a step of bonding a second silicon substrate to said main surface of said first silicon substrate, wherein said step of bonding includes treating said first and second silicon substrates in an oxidizing atmosphere at 1100° to 1200° C.; and a step of removing a peripheral portion of said first silicon substrate from a surface opposite said main surface to expose said alignment patterns composed of said insulator films buried in said peripheral portion of said main surface.

* * * * *